US011134588B2

(12) United States Patent
Gao

(10) Patent No.: US 11,134,588 B2
(45) Date of Patent: Sep. 28, 2021

(54) CROSSFLOW AIR COOLING MODULE FOR ELECTRONIC EQUIPMENT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 39 days.

(21) Appl. No.: 16/794,025

(22) Filed: Feb. 18, 2020

(65) Prior Publication Data
US 2021/0259139 A1   Aug. 19, 2021

(51) Int. Cl.
*H05K 7/20* (2006.01)
(52) U.S. Cl.
CPC ..... *H05K 7/20745* (2013.01); *H05K 7/20145* (2013.01); *H05K 7/20172* (2013.01)
(58) Field of Classification Search
CPC ...... G06F 1/20; G06F 2200/201; G06F 1/206; H05K 7/20145; H05K 7/20172; H05K 7/20745; H05K 7/20209; H05K 7/20736; H05K 7/20727; H05K 7/20581; H05K 7/20836; H05K 7/20136; H05K 7/20181
USPC ......... 361/679.51, 695, 679.48, 678, 679.46, 361/689, 694; 165/80.3; 454/184
See application file for complete search history.

(56) References Cited

U.S. PATENT DOCUMENTS 7,859,840 B2 * 12/2010 Chang .................. G06F 1/1632
361/695

* cited by examiner

*Primary Examiner* — Mandeep S Buttar
(74) *Attorney, Agent, or Firm* — Womble Bond Dickinson (US) LLP

(57) ABSTRACT

Embodiments are disclosed of an airflow cooling solution for a battery backup unit (BBU) using a crossflow cooling module. The cooling module includes a housing with a module inlet and a module outlet positioned at a non-zero angle relative to each other. The module outlet has an area greater than the module inlet. A crossflow fan package is positioned in the cooling module housing. The crossflow fan package includes a fan housing having a fan inlet and a fan outlet; the fan inlet is fluidly coupled to the module inlet, and the fan outlet is fluidly coupled to the module outlet. One or more inlet air baffles form an inlet air channel between the module inlet and the fan inlet, and one or more outlet air baffles form a diverging outlet air channel between the fan outlet and the module outlet. The cooling module can distribute the airflow to a much wider area to the BBU module. Then a rack level crossflow air cooling configuration is proposed.

20 Claims, 8 Drawing Sheets

CROSSFLOW AIR COOLING MODULE FOR ELECTRONIC EQUIPMENT

TECHNICAL FIELD

The disclosed embodiments relate generally to cooling of electronic equipment and in particular, but not exclusively, to a crossflow air cooling module for electronic equipment.

BACKGROUND

Battery Backup Units (BBUs) are used in data centers and server racks to provide backup energy to servers, routers, and other electronic equipment in racks within the data center. Typically, BBUs are positioned in a rack together with other electronic equipment (such as servers and other IT equipment) and expected to provide electrical power to the equipment within their rack for a certain period of time until power from the main data center's electrical power source, rather than battery power, can be restored to the devices in the rack.

BBUs are essentially a battery pack or package with multiple individual battery cells inside. When they supply electrical power, the cells generate a large amount of heat as they discharge. Storage temperature for cells is critical for the battery cell lifetime and normal operation, but thermal management—i.e., regulating the temperature of the cells within the BBU—is a challenge when multiple cells are packaged close together because the gaps between individual cells may not be sufficient for airflow to pass through to extract the heat. The problem becomes more challenging when the cooling airflow must travel a long distance to pass multiple rows of cells. The nature of thermal condition within a battery package is a high airflow resistance and uniformly heat dissipation package.

Cooling airflow for a server generally flows from the front to the rear; this is why many data centers have a cold aisle/hot aisle arrangement. But airflow management for the battery cells in a BBU requires delivery of the cooling air consistently across a wide supply area. Current battery packs are limited by the rack space and rack form factors, making it a challenge to manage the airflow to cover as many cells as possible within the BBU. Another challenge is the power rating and backup time requirement is more and more critical which results in more challenge to a BBU design.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described of an apparatus and system for crossflow air cooling module for electronic equipment. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The disclosed embodiments describe a crossflow cooling module that includes one or more cross flow air movers. These air movers are used for moving airflow from a data center cold aisle, changing the airflow direction by 90 degrees (although other angles are possible in other embodiments), and supplying the airflow to heat-generating components, such as BBU battery cells, in a compartment fluidly coupled to the crossflow cooling module. The air flow is then supplied to the battery pack in a vertical direction and is pushed through the battery cells before leaving the battery pack into a data center hot aisle. Louvers can be used on at least one of the openings.

Figure 1:
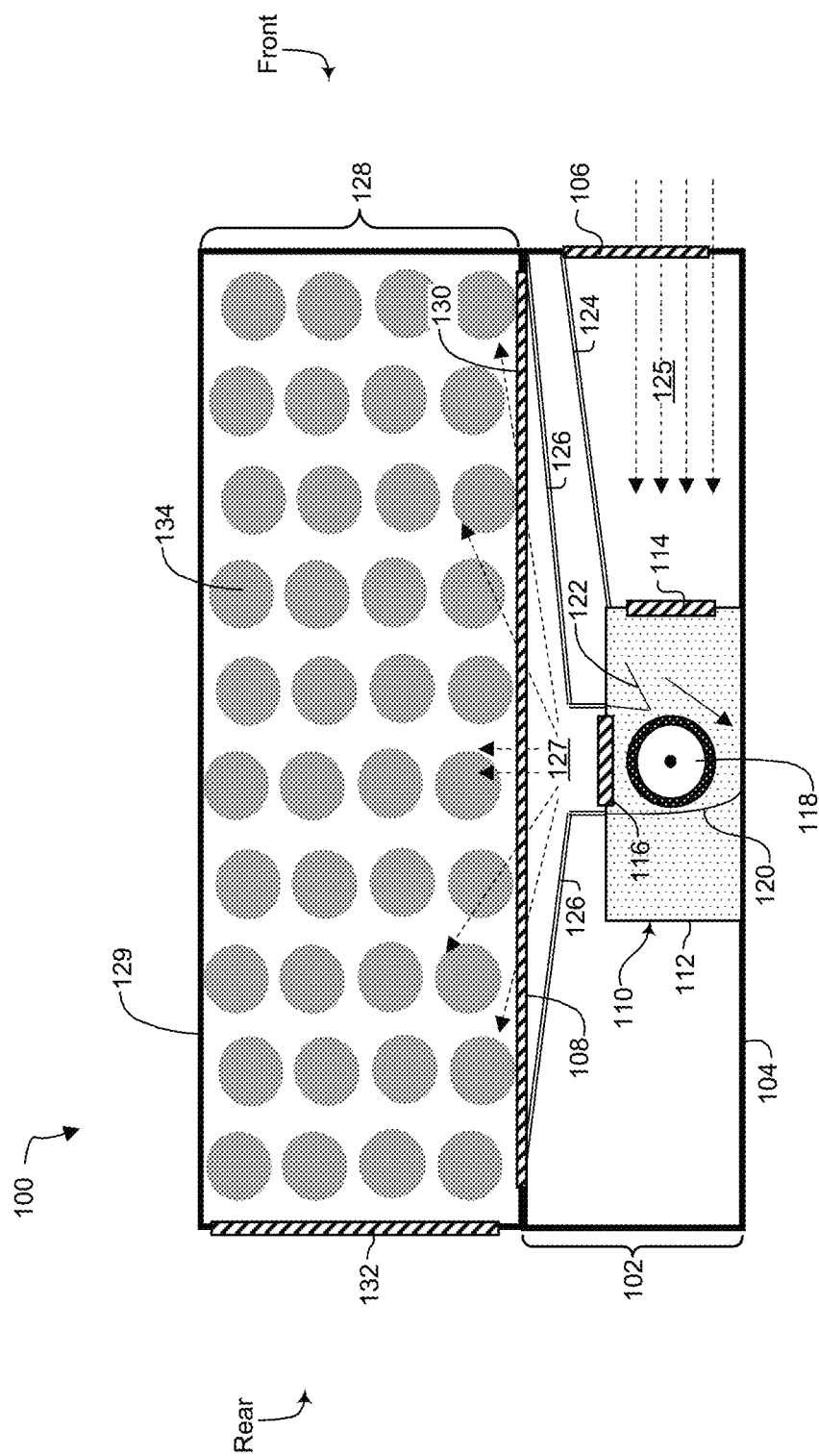
FIG. 1 is a cross-sectional view of an embodiment of a crossflow air cooling module.

FIG. 1 illustrates an embodiment of a crossflow cooling arrangement 100. Crossflow cooling arrangement 100 includes a crossflow cooling module 102 fluidly coupled to a compartment 128 containing electronic equipment. As used herein, the term "fluidly coupled" means coupled in such a way that fluid can be exchanged directly or indirectly. Thus, if A is fluidly coupled to B then fluid can be exchanged in either direction between A and B, directly or through another element interposed between A and B.

Crossflow cooling module 102 includes a cooling module housing 104 having a module inlet 106 and a module outlet 108. In the illustrated embodiment module inlet 106 has a smaller area than module outlet 108. Module inlet 106 is also positioned at a non-zero angle relative to module outlet 108—in other words, a plane through module inlet 106 is at an angle relative to a plan through module outlet 108 or, put differently, the normal vector of module outlet 108 is at an angle relative to the normal vector of module inlet 106. In the illustrated embodiment module outlet 108 is substantially perpendicular to module inlet 106 (i.e., the angle between them is substantially 90 degrees), but other embodiments can have a different angle than shown between module outlet 108 and module inlet 106. In some embodiments (see, e.g., FIG. 3), module inlet 106 can be covered with louvers for safety or other reasons.

A crossflow fan package 110 is positioned within cooling module housing 104.

Crossflow fan package 110 includes a fan housing 112 having a fan inlet 114 through which air enters fan housing 112 and a fan outlet 116 through which air exits fan housing 112. Fan inlet 114 is positioned at a non-zero angle relative to fan outlet 116—i.e., a plane through fan inlet 114 is at an angle relative to a plane through fan outlet 116 or, put differently, the normal vector of fan outlet 116 is at an angle relative to the normal vector of fan inlet 114. In the illustrated embodiment fan outlet 116 is substantially perpendicular to fan inlet 114 (i.e., the angle between them is substantially 90 degrees), but other embodiments can have a different angle than shown.

Positioned within fan housing 112 is a fan including a fan motor (not shown) coupled to an impeller 118. In the illustrated embodiment impeller 118 is a tangential impeller, but in other embodiments impeller 118 can be a different type of impeller such as a radial or axial impeller. A guide plate 120 is positioned adjacent to impeller 118 and is fixed to fan housing 112 in such a way that it helps impeller 118 turn and guide the flow entering through fan inlet 114 and direct it toward fan outlet 116. In the illustrated embodiment guide plate 120 is curved, but in other embodiments it can have a different construction. For instance, in other embodiments guide plate 120 can be flat or can include multiple flat panels. A vortex tongue 122 is fixed to housing 112 and is positioned substantially on the opposite side of impeller 118 from guide plate 120. Vortex tongue 122 helps to control the location of the vortex created by impeller 118 when it spins. In the illustrated embodiment vortex tongue 122 is an angled plate fixed to fan housing 122, but in other embodiments it can have a different construction, placement, or attachment to the housing than shown.

Air baffles are positioned within cooling module housing 104 to couple the respective inlets and outlets and to form air channels that help guide flowing air. In one embodiment air flow through the air channels can be laminar. An inlet air baffle 124 is coupled to cooling module housing 104 and fan housing 112 so that, alone or together with cooling module housing 104, it forms an inlet air channel 125 between module inlet 106 and fan inlet 114. In the illustrated embodiment air channel 125 converges (i.e., its cross-sectional area decreases in the flow direction), but in other embodiments it can diverge (i.e., its cross-sectional area increases in the flow direction), or be straight (i.e., its cross-sectional area is constant in the flow direction). 124 is used for generating laminar air flow for the 110. Similarly, an air baffle 126 is coupled to cooling module housing 104 and to fan housing 112 so that, alone or together with other elements such as fan housing 112, it forms an outlet air channel 127 between fan outlet 116 and module outlet 108. In the illustrated embodiment outlet air channel 127 the area of fan outlet 116 is substantially smaller than the area of module outlet 108, so that outlet air channel 127 diverges to distribute the airflow from the fan outlet to the larger module outlet 108. But in other embodiments, depending on the details of fan package 110 and module outlet 108, outlet air channel 127 can converge of be straight.

Electronics compartment 128 is not part of cooling module 102 but is fluidly coupled to it. Electronics compartment 128 includes a housing 129 within which are positioned one or more components of electronic equipment. In the illustrated embodiment the electronic equipment in housing 129 is a battery backup unit (BBU) made up of numerous individual battery cells 134, but in other embodiments compartment 128 can house other types of electronic equipment such as servers, router, and the like. Housing 129 has a cool air inlet 130 that is fluidly coupled to module outlet 108 and through which cool air from cooling module 102 flows into housing 129. Housing 129 also has a hot air outlet 132 through which hot air exits compartment 128.

In operation of arrangement 100, the fan motor drives impeller 118, which draws cool air into housing 104 through module inlet 106. Simultaneously with, and in addition to, the air flow caused by impeller 118, air flow can also be moved by the data center's air movers and the rack's own air movers, if any. After entering housing 104, the air is directed by the housing and by baffle 124 toward fan inlet 114. As cool air enters fan housing 112, impeller 118, guide plate 120, and vortex tongue 122 turn the flow of cool air through an angle (90 degrees in this embodiment) and send it out of fan housing 112 through fan outlet 116. Air baffles 126 guide the cool air exiting through fan outlet 116 to the module outlet 108. Cool air then flows into compartment 128 through cool air inlet 130, which substantially coincides with module outlet 108. Cool air enters compartment 128 and flows over heat-generating components such as battery cells 134, thus extracting heat from them. The heat from the battery cells 134 heats the flowing air, which then flows out of compartment 128 through hot air outlet 132.

In a data center setup with alternating cold aisles and hot aisles, cold air would be drawn through module inlet 106 from a cold aisle and exhausted through hot air outlet 132 into a hot aisle. In this way, cooling module 102 takes in cold air through the relatively smaller area of module inlet 106 and spreads the cool air out over the relatively larger area of module outlet 108, so that the cool air can be injected into compartment 128 from its side rather than from its front, as is customary. This immediately provides cool air throughout the entire depth of compartment 128, making cooling of battery cells 134 more effective and maintaining them at a lower temperature.

Figure 2:
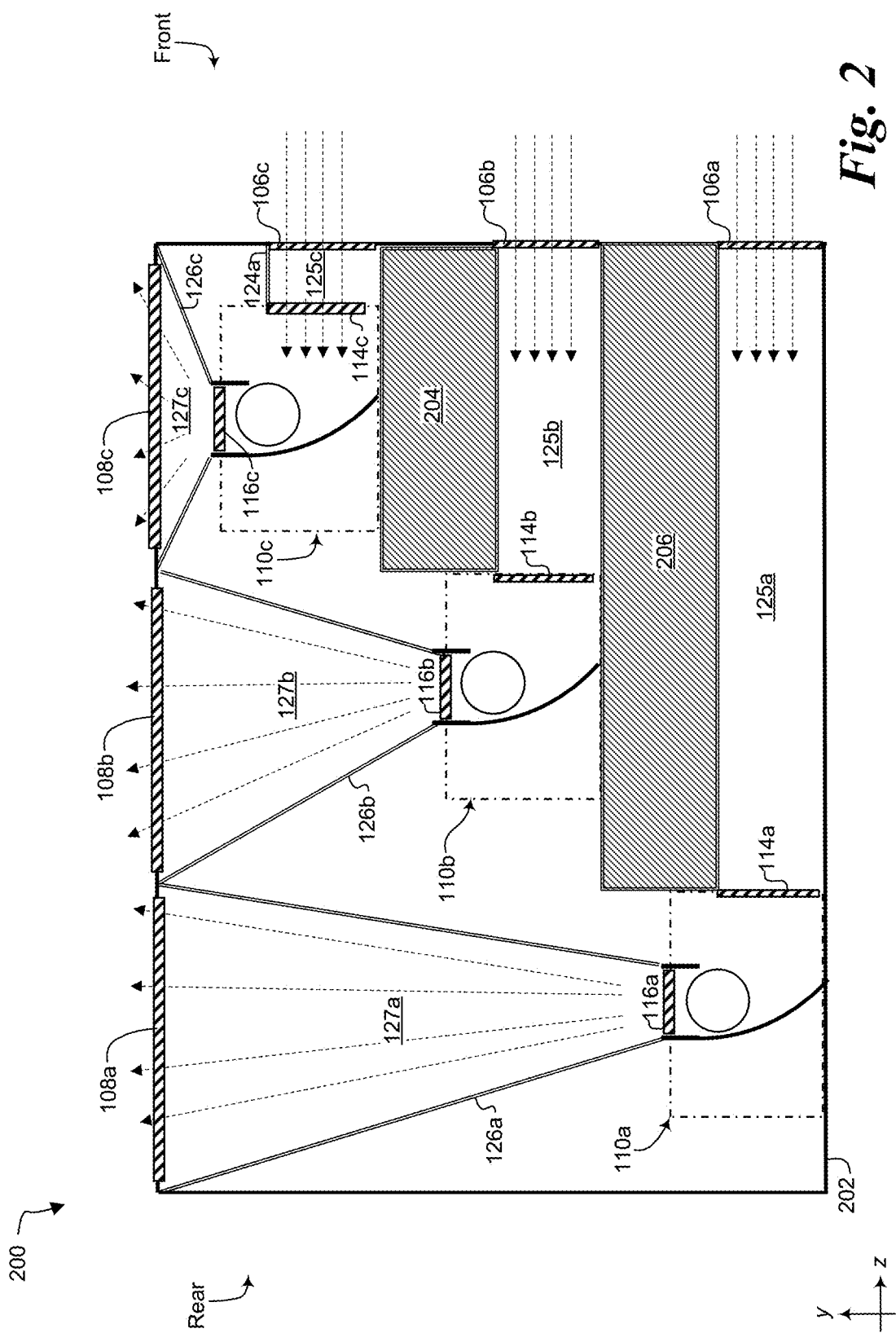
FIG. 2 is a cross-sectional view of another embodiment of a crossflow air cooling module.

FIG. 2 illustrates another embodiment of a crossflow cooling module 200. Cooling module 100 uses a single fan package 110, such that crossflow cooling module 100 has one inlet and one outlet. Cooling module 200, by contrast, uses multiple fan units 110. And because it uses multiple fan packages 110, crossflow cooling module 200 has multiple inlets and multiple outlets.

Crossflow cooling module 200 includes multiple crossflow fan packages 110. In the illustrated embodiment there are three crossflow fan packages 110a-110c, but other embodiments can use different number of fan packages 110. Each crossflow fan package 110a-110c has the same attributes and variations describe above for fan package 110. Crossflow fan packages 110a-110c are spaced apart from each other in two dimensions: in the illustrated embodiment, they are spaced apart from each other in both they and z dimensions. Each fan package 110 is fluidly coupled to a corresponding module inlet 106 on the front of housing 202 and module outlet 108 on the top side of housing 202: fan package 110a is fluidly coupled to inlet 106a and outlet 108a, fan package 110b is fluidly coupled to inlet 106b and outlet 108b, and so on. Because of the two-dimensional offset between fan packages 110a-110c, module inlets 106a-106c are spaced apart in they direction and module outlets 108a-108c are spaced apart in the z direction.

Structural inserts 204 and 206 are positioned within housing 202 to provide structural support to fan packages 110a-110c as well as to form airflow channels. In addition, structural inserts 204 and 206 work with each other, or with other elements such as air baffle 124 or housing 202, to form inlet air channels 125a-125c that guide airflow, preferably laminar airflow, from each inlet 106 to its corresponding fan inlet 114. And, as in crossflow cooling module 102, in different embodiments inlet air channels 125 can converge, diverge, or be straight. FIG. 2 presents that the channel is formed in a straight manner by using 204 and 206. In addition to their structural function, then, structural inserts 204 and 206 function as air baffles, analogously to air baffle 124 in crossflow cooling module 100. Similarly, air baffles 126a-126c are coupled to housing 202 and their corresponding fan packages 110a-110c to form outlet air channels 127a-127c that direct airflow from fan outlets 116a-116c to their respective module outlets 108a-108c. As with crossflow cooling module 102, in different embodiments outlet air channels 127 can converge, diverge, or be straight.

In operation, crossflow cooling module 200 operates substantially the same way as crossflow cooling module 100. But because it has multiple fan packages 110, crossflow cooling module 200 has more redundancy and flexibility. In some embodiments, multiple fan packages 110 mean that each fan package operates independently and if one fan package fails the others can take up the slack. In one embodiment module outlets 108a-108c can all be directed into the same compartment for cooling, but in other embodiments each module outlet 108a-108c can be directed mainly into its own corresponding compartment. In still other embodiments, some of module outlets 108a-108c can service a single compartment while others service multiple compartments.

Figure 3:
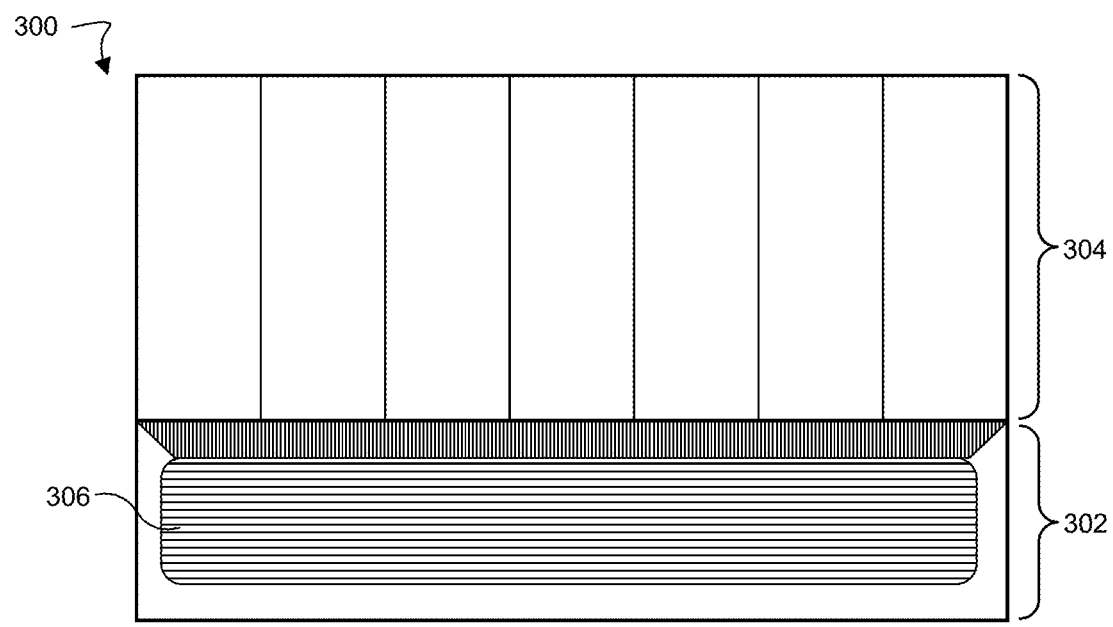
FIG. 3 is a front view of an embodiment of an electronics compartment coupled to a crossflow air cooling module.

FIG. 3 illustrates another embodiment of a crossflow cooling arrangement 300 viewed from the front. Crossflow cooling arrangement 300 is substantially similar to cooling arrangement 100: a crossflow cooling module 302 is fluidly coupled to a compartment 304 having heat-generating electronic equipment therein. Embodiments of crossflow cooling module 302 have substantially the same attributes and variations as described above for crossflow cooling module 102 of cooling arrangement 100. In the illustrated embodiment louvers 306 cover the module inlet of crossflow cooling module 302 for safety, aesthetic, or other reasons, but other embodiments need not have louvers. Louvers can also be installed on the hot air outlet (see FIG. 1) or other inlets or outlets.

Figure 4A:
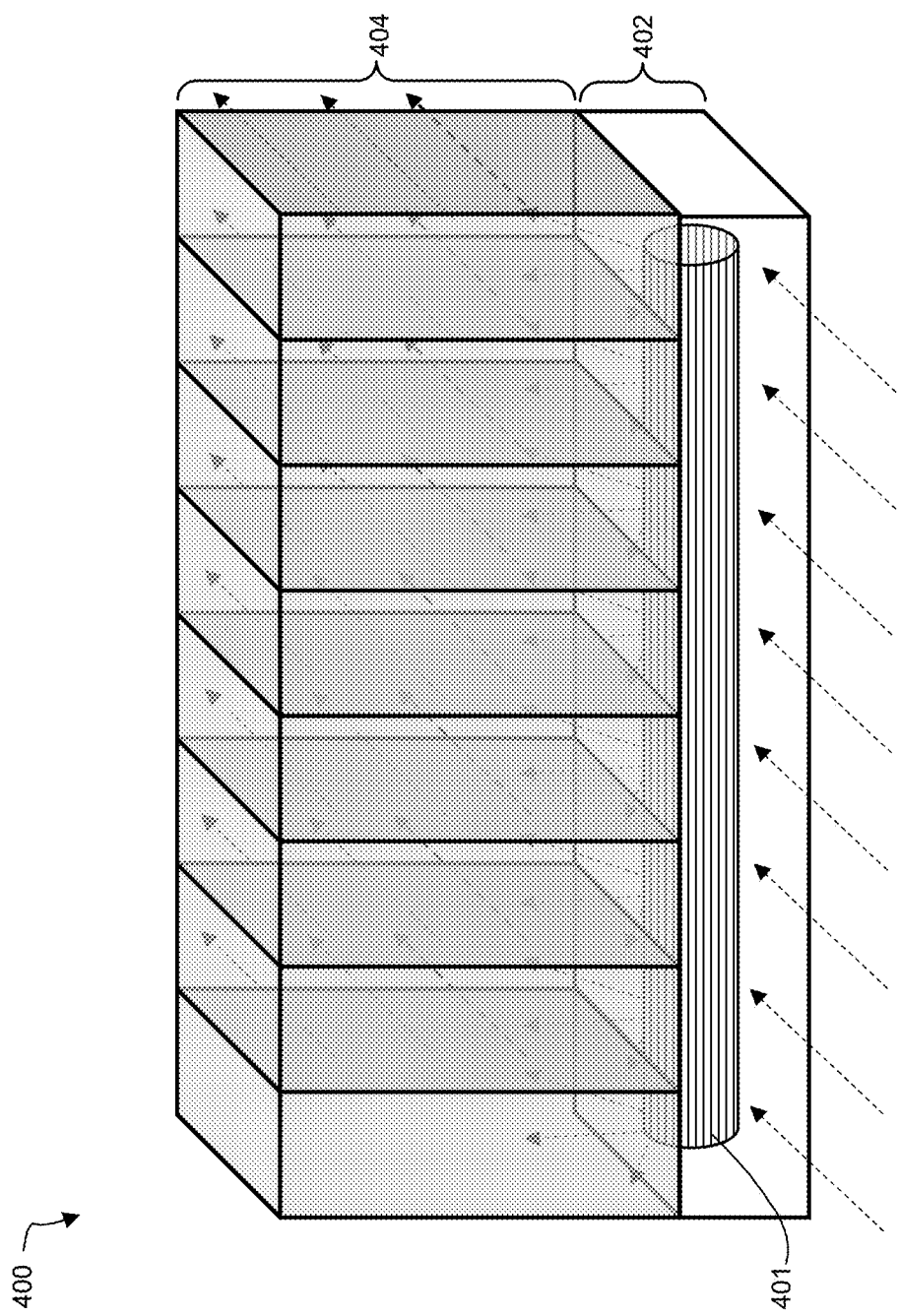
FIGS. 4A-4C are perspective views of an embodiment of a data center.
Figure 4B:
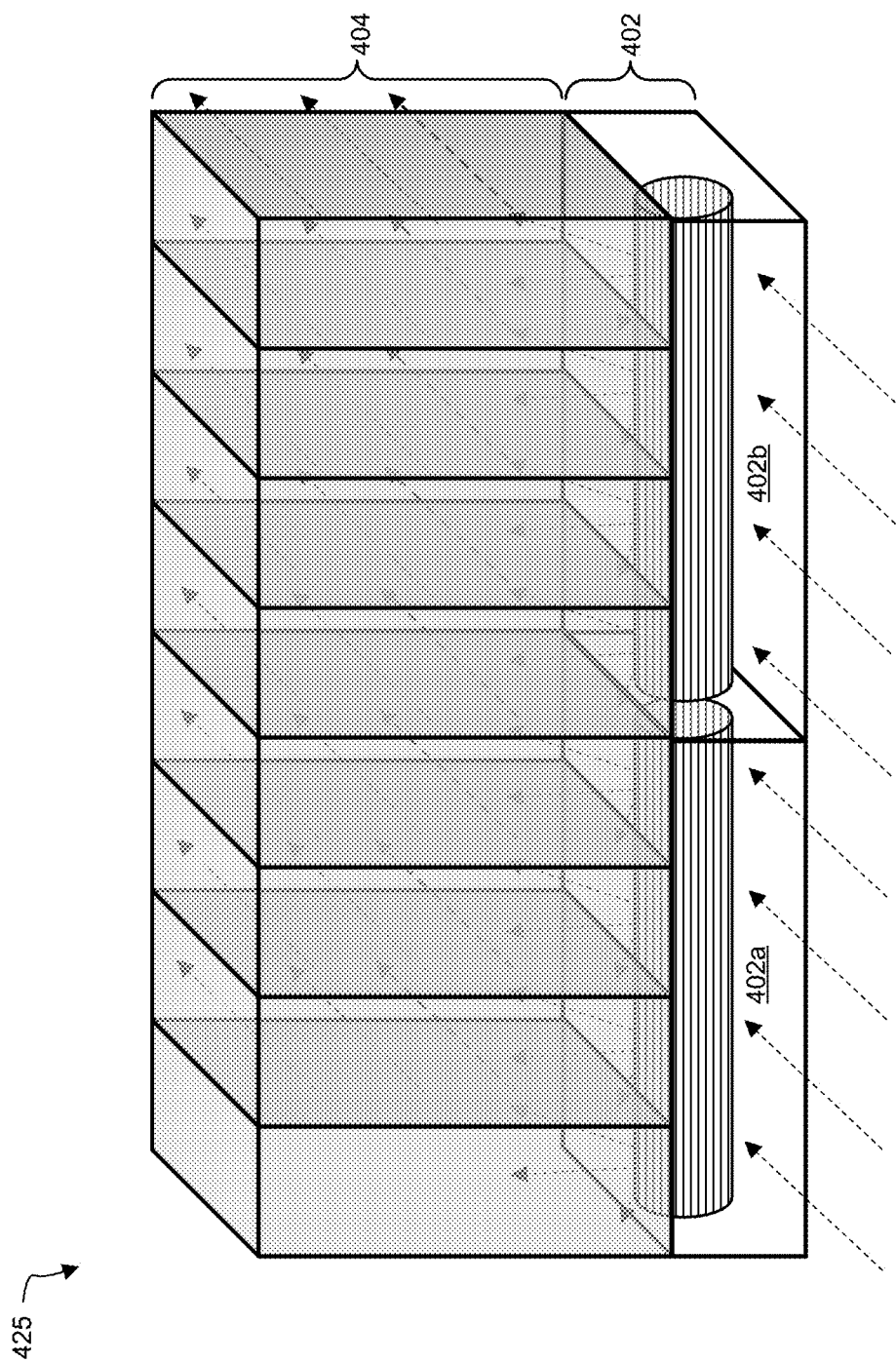
Figure 4C:
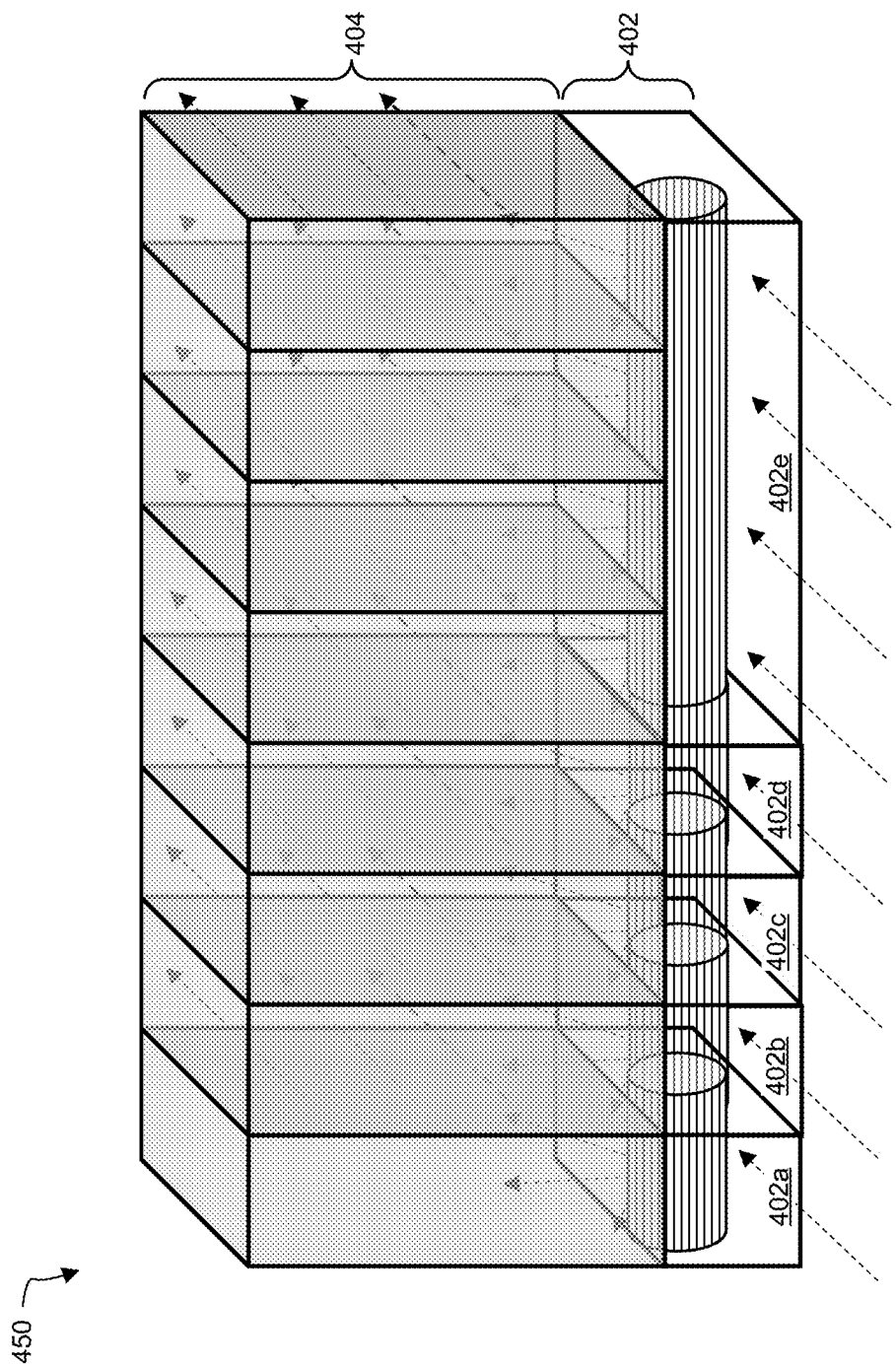

FIGS. 4A-4C illustrate applications of a crossflow cooling module. Generally, because it is modular, a crossflow cooling module such as cooling module 100 or cooling module 200 provide much flexibility in providing a cooling solution. In different embodiments there can be a one-to-one correspondence, a one-to-many correspondence, or a many-to-one correspondence between a crossflow cooling module and compartments, or partitions within a compartment, that it cools. In the illustrated embodiments the heat-generating electronic components within the enclosure are blade servers positioned vertically in the enclosure, but in other embodiments the heat-generating electronic components can be other components such as battery cells in a BBU.

FIG. 4A illustrates an embodiment of a cooling arrangement 400 with a single crossflow cooling module 402, with its impeller 401, fluidly coupled to a single compartment 404 having multiple blade servers. This is an example of a one-to-one correspondence between a crossflow cooling module and compartments. As described above, cold air enters module 402 from the cold aisle, is redirected by the fan module and supplied to the compartment 404, finally air exits the compartment 404 to a hot aisle. FIG. 4B illustrates an embodiment of a cooling arrangement 425 with multiple crossflow cooling modules 402a and 402b fluidly coupled to a single compartment 404 having multiple blade servers. This is an example of a many-to-one correspondence between cooling modules and compartments. FIG. 4C illustrates an embodiment of a cooling arrangement 450 with multiple crossflow cooling modules 402a-402b fluidly coupled to part of a single compartment 404 having multiple blade servers. Another crossflow cooling module 402e is coupled to the remaining part of enclosure 404. This is another example of a many-to-one correspondence between cooling modules and compartments. Although not illustrated, other embodiments can have a one-to-many correspondence—i.e., a single cooling module cooling multiple compartments.

Figure 5:
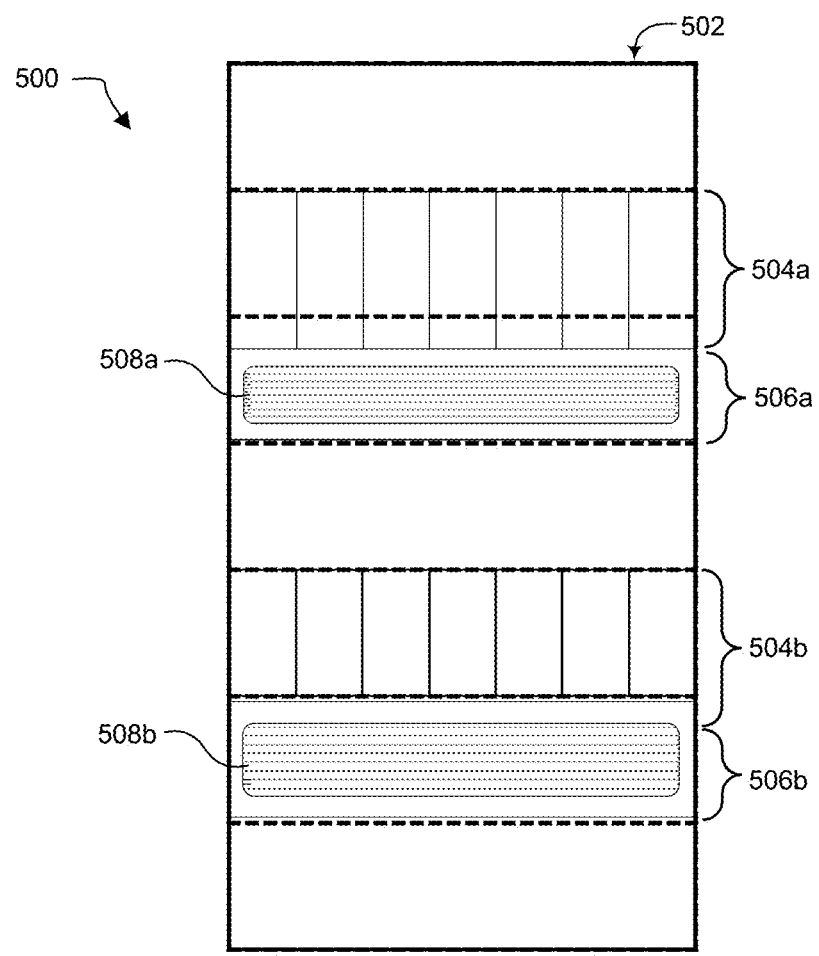
FIG. 5 is a front view of an embodiment of an electronics rack including electronics compartments coupled to crossflow air cooling modules.

FIG. 5 illustrates an embodiment of a rack arrangement 500 including one or more crossflow cooling modules. Rack arrangement 500 includes an electronics rack 502 within which are positioned one or more compartments 504 having therein heat-generating electronics equipment. The illustrated embodiment shows two compartments 504a and 504b, but other embodiments of rack 502 can include more or less compartments than shown. In different embodiments the electronic equipment within enclosures 504 can be battery backup units (BBUs), IT equipment such as servers, blade servers, routers, or other equipment, or some combination of these. A crossflow cooling module 506, which can be any crossflow cooling module described herein, is fluidly coupled to each compartment 504: cooling module 506a is fluidly coupled to compartment 504a, cooling module 506 is fluidly coupled to compartment 506b, and so on. When the cooling module and enclosures are designed as one complete module, the height of them can be customized instead of using the standard height of a compartment, as shown in 504a and 504b. Rack 502, with compartments 504 and crossflow cooling modules 506 in it, can be installed in a data center (see FIG. 6).

Figure 6:
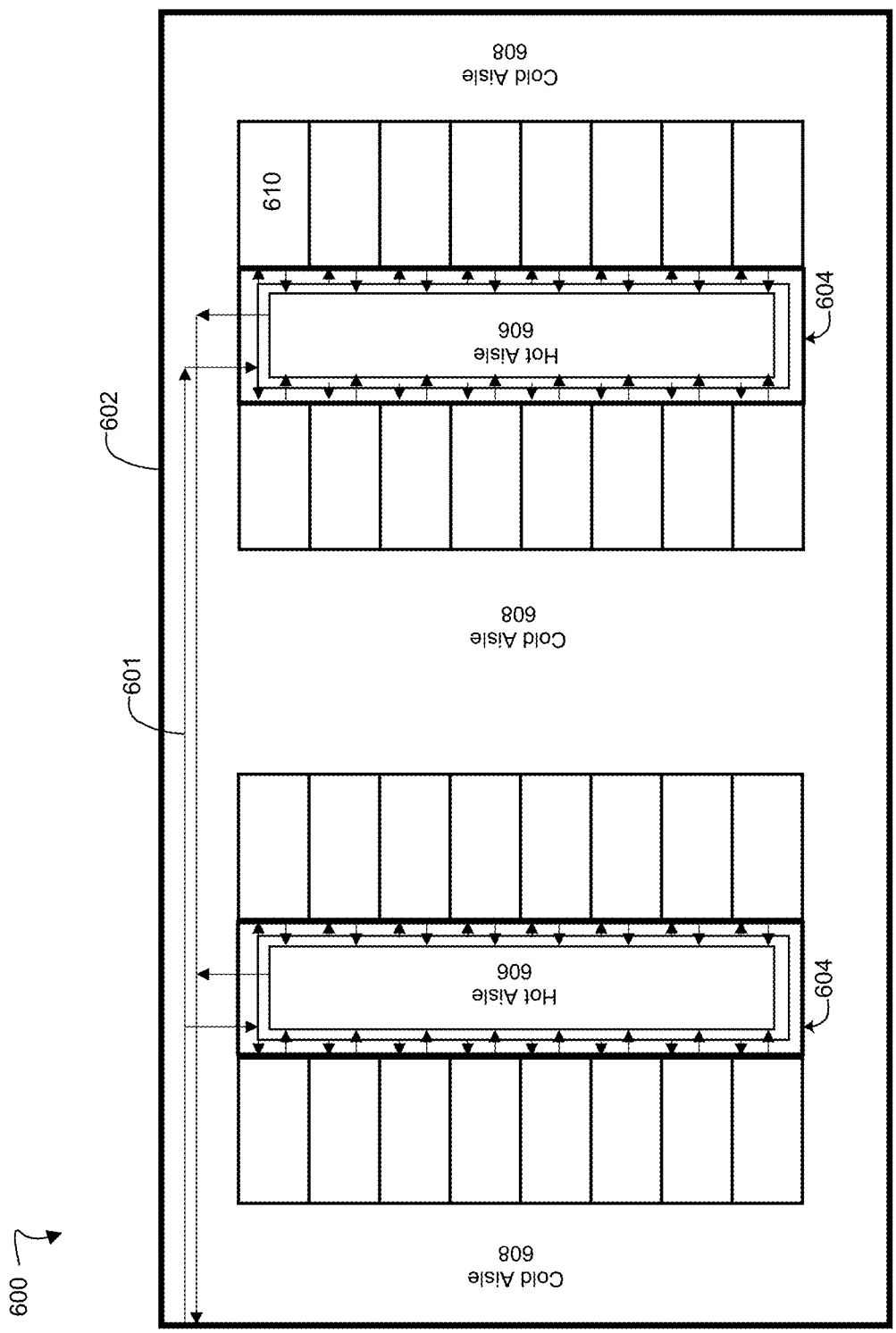
FIG. 6 is a perspective view of another embodiment of an electronics compartment coupled to a crossflow air cooling module.

FIG. 6 illustrates an embodiment of a data center 600. Data center 600 includes an enclosure 602, which in one embodiment can be a building but in another embodiment can be a subset of a building, such as a room. In the illustrated embodiment, electronic equipment—servers, routers, and the like—that is positioned in racks 610 that are arranged within data center 600 in alternating hot aisles 606 and cold aisles 608. In this arrangement, one or more racks 610, at least one of which includes a crossflow cooling module as described above, are positioned around a data center pod 604 with the rear part of each rack 610 coupled to the data center pod. An interior of data center pod 604 forms the hot aisle 606, which is sandwiched between a pair of cold aisles 608. Each data center pod 604 is coupled to external (i.e., outside the data center) cooling, power, networking, and other services 601. In this arrangement, cool air from cold aisles 608 is drawn into each crossflow cooling module in rack 610 through the front of the rack. Hot air is expelled from the hot air outlet at the back of each rack 610 into hot aisle 606, from which it is extracted from enclosure 602 by cooling services 601.

Other embodiments are possible besides the ones described above. For instance:
  The cooling module can be assembled on the top of the cell or maybe on the side of the cell packs.
  The air flow management method can be used for other applications where air must be supplied over a wide inlet area.
  Louvers can be added to inlets, outlets, and other openings for safety or other purposes.
  Other types of fans or air moving devices can be used to replace the tangential fan package to achieve similar results.
  One single BBU module can be integrated with multiple cooling modules or the air flow management configuration proposed in the invention (see, e.g., FIGS. 4B-4C).

The above description of embodiments is not intended to be exhaustive or to limit the invention to the described forms. Specific embodiments of, and examples for, the invention are described herein for illustrative purposes, but various modifications are possible.

What is claimed is:

1. A crossflow cooling module, comprising:
   a cooling module housing including a module inlet and a module outlet, the module outlet being positioned at a non-zero angle relative to the module inlet and the module outlet having an area greater than the module inlet;
   a crossflow fan package positioned in the cooling module housing, the crossflow fan package including a fan housing having a fan inlet and a fan outlet, the fan inlet being fluidly coupled to the module inlet, the fan outlet being fluidly coupled to the module outlet, and an area of the fan outlet being smaller than an area of the module outlet;
   an inlet air baffle positioned in the cooling module housing to form an inlet air channel between the module inlet and the fan inlet; and
   an outlet air baffle positioned in the cooling module housing to form a diverging outlet air channel between the fan outlet and the module outlet.

2. The crossflow cooling module of claim 1, wherein the crossflow fan package comprises:
   a fan including an impeller positioned in the fan housing to draw air into the fan inlet and re-direct the air to the fan outlet,
   a guiding plate attached to the fan housing and fluidly coupled to the impeller to assist the impeller in changing a flow direction between the fan inlet and the fan outlet; and
   a vortex tongue attached to the fan housing to control a location of a vortex created by the impeller.

3. The crossflow cooling module of claim 2, wherein the vortex tongue and the guiding plate are substantially on opposite sides of the impeller.

4. The crossflow cooling module of claim 2, wherein the impeller is a tangential impeller.

5. The crossflow cooling module of claim 1, wherein the module inlet is substantially perpendicular to the module outlet and wherein the fan inlet is substantially perpendicular to the fan outlet.

6. The crossflow cooling module of claim 1, wherein the inlet air channel is formed by the inlet air baffle and the cooling module housing.

7. The crossflow cooling module of claim 1, wherein at least one boundary of the outlet air channel is formed by the outlet air baffle.

8. The crossflow cooling module of claim 1, wherein the inlet air channel is converging, diverging, or of constant cross-sectional area.

9. A system, comprising:
   an electronics compartment having at least one heat-generating component therein and having a cool air inlet and a hot air outlet;
   one or more crossflow cooling modules fluidly coupled to the cool air inlet, each of the one or more crossflow cooling modules including:
      a cooling module housing including a module inlet and a module outlet, the module outlet being positioned at a non-zero angle relative to the module inlet, the module outlet having an area greater than the module inlet, and the module outlet being fluidly coupled to the cool air inlet of the electronics compartment;
      a crossflow fan package positioned in the cooling module housing, the crossflow fan package including:
         a fan housing having a fan inlet and a fan outlet, the fan inlet being fluidly coupled to the module inlet, the fan outlet being fluidly coupled to the module outlet, and an area of the fan outlet being smaller than an area of the module outlet,
      an inlet air baffle positioned in the cooling module housing to form an inlet air channel between the module inlet and the fan inlet, and
      an outlet air baffle positioned in the cooling module housing to form a diverging outlet air channel between the fan outlet and the module outlet.

10. The system of claim 9, wherein the crossflow fan package comprises:
    a fan including an impeller positioned in the fan housing to draw air into the fan inlet and re-direct the air to the fan outlet,
    a guiding plate attached to the fan housing and fluidly coupled to the impeller to assist the impeller in changing a flow direction between the fan inlet and the fan outlet; and
    a vortex tongue attached to the fan housing to control a location of a vortex created by the impeller.

11. The system of claim 10, wherein the vortex tongue and the guiding plate are substantially on opposite sides of the impeller and wherein the impeller is a tangential impeller.

12. The system of claim 10, wherein at least one of the one or more crossflow cooling modules comprises multiple crossflow fan packages, each crossflow fan package having its own dedicated module inlet, module outlet, inlet air channel, and outlet air channel.

13. The system of claim 9, wherein the module inlet is substantially perpendicular to the module outlet and wherein the fan inlet is substantially perpendicular to the fan outlet.

14. The system of claim 9, wherein the inlet air channel is formed by the inlet air baffle and the cooling module housing.

15. The system of claim 9, wherein the inlet air channel is converging, diverging, or of constant cross-sectional area.

16. The system of claim 9, wherein the cool air inlet draws in cool air from a cold aisle in a data center.

17. The system of claim 16, wherein the hot air outlet exhausts hot air from the electronics compartment to a hot aisle in a data center.

18. A data center, comprising:
    alternating hot aisles and cold aisles;
    at least one rack positioned in the data center with its front facing a cold aisle and its rear facing a hot aisle;
    one or more electronics compartments positioned in the at least one rack, the one or more electronics compartments having at least one heat-generating component therein and having a cool air inlet and a hot air outlet;
    a crossflow cooling module fluidly coupled to the cool air inlet of at least one of the electronics compartments, the crossflow cooling module including:
       a cooling module housing including a module inlet and a module outlet, the module outlet being positioned at a non-zero angle relative to the module inlet, the module outlet having an area greater than the module inlet, and the module outlet being fluidly coupled to the cool air inlet of the electronics compartment;
       a crossflow fan package positioned in the cooling module housing, the crossflow fan package including:
          a fan housing having a fan inlet and a fan outlet, the fan inlet being fluidly coupled to the module inlet, the fan outlet being fluidly coupled to the module outlet, and an area of the fan outlet being smaller than an area of the module outlet, an inlet air baffle positioned in the cooling module housing to form an inlet air channel between the module inlet and the fan inlet, and an outlet air baffle positioned in the cooling module housing to form a diverging outlet air channel between the fan outlet and the module outlet.

19. The data center of claim 18, wherein the cool air inlet draws in cool air from the cold aisle in a data center.

20. The data center of claim 19, wherein the hot air outlet exhausts hot air from the electronics compartment to a hot aisle in a data center.

\* \* \* \* \*